US007020509B2

(12) United States Patent
Heid (10) Patent No.: US 7,020,509 B2
(45) Date of Patent: Mar. 28, 2006

(54) MAGNETIC RESONANCE TOMOGRAPHY APPARATUS AND METHOD EMPLOYING A TRUE FISP SEQUENCE WITH IMPROVED OFF-RESONANT BEHAVIOR OF TWO SPIN ENSEMBLES

(75) Inventor: Oliver Heid, Gunzenhausen (DE)

(73) Assignee: Siemens Aktiengesellschaft, Munich (DE)

( * ) Notice: Subject to any disclaimer, the term of this patent is extended or adjusted under 35 U.S.C. 154(b) by 854 days.

(21) Appl. No.: 09/929,730

(22) Filed: Aug. 14, 2001

(65) Prior Publication Data
US 2002/0042567 A1    Apr. 11, 2002

(30) Foreign Application Priority Data
Aug. 21, 2000 (DE) ............... 100 40 850

(51) Int. Cl.
*A61B 5/00* (2006.01)
(52) U.S. Cl. .................. 600/410; 600/407; 600/411; 600/418; 600/425; 600/427; 324/308; 324/309; 324/310; 324/317; 324/319
(58) Field of Classification Search ............ 600/407, 600/410, 422, 425, 411, 418, 427; 324/307, 324/309, 308, 317, 310, 319
See application file for complete search history.

(56) References Cited

U.S. PATENT DOCUMENTS

| | | | |
|---|---|---|---|
| 4,769,603 A | | 9/1988 | Oppelt et al. |
| 5,541,514 A | * | 7/1996 | Heid et al. .................. 324/309 |
| 5,627,469 A | | 5/1997 | Hong et al. |
| 5,662,112 A | * | 9/1997 | Heid .......................... 600/413 |
| 5,668,474 A | * | 9/1997 | Heid .......................... 324/309 |
| RE35,656 E | * | 11/1997 | Feinberg et al. ............ 324/309 |
| 5,726,569 A | * | 3/1998 | Krieg et al. ................. 324/309 |
| 6,121,775 A | * | 9/2000 | Pearlman ..................... 324/309 |
| 6,298,258 B1 | * | 10/2001 | Heid et al. ................... 600/410 |
| 6,310,478 B1 | * | 10/2001 | Heid .......................... 324/309 |
| 6,366,090 B1 | * | 4/2002 | Heid .......................... 324/307 |
| 6,369,569 B1 | * | 4/2002 | Heid .......................... 324/309 |
| 6,539,246 B1 | * | 3/2003 | Heid .......................... 600/410 |
| 6,636,038 B1 | * | 10/2003 | Heid .......................... 324/314 |
| 2002/0045814 A1 | * | 4/2002 | Heid .......................... 600/410 |

FOREIGN PATENT DOCUMENTS

| | | |
|---|---|---|
| DE | OS 198 36 612 | 2/2000 |
| DE | OS 199 31 292 | 2/2001 |
| EP | 0 745 865 | 12/1996 |

\* cited by examiner

*Primary Examiner*—Brian L. Casler
*Assistant Examiner*—William Jung
(74) *Attorney, Agent, or Firm*—Schiff Hardin LLP (57) ABSTRACT

In a magnetic resonance tomography apparatus employing a FISP pulse sequence, the pulse sequence is repeated with a repetition time $T_R$ with different phase-coding gradient directions and with an alternating operational sign of the flip angle $\alpha$. The gradient pulse trains are thereby completely balanced. A phase increment $\Delta\Phi=\beta$ is generated in addition to the alternating operational sign of the flip angle $\alpha$ between successive excitation pulses, so that the steady state signals for a first and a second spin ensemble optionally have either identical or reversed signal polarities. A first dataset on the basis of identical signal polarities and a second dataset on the basis of reversed signal polarities are obtained by means of the free selection of the mutual signal polarities. A pure image of the first and the second spin ensembles is thus obtained by the addition and/or subtraction of the first and second datasets.

14 Claims, 9 Drawing Sheets

$|\beta_F - \beta_W| \in [180°; 360°]$
$\beta = 180° \Delta f\, T_R$

FIG 6c $|\beta_F - \beta_W| \in [360°; 540°]$
$\beta = +180° \Delta f\, T_R - 360°$

FIG 6d $\beta = +180° \Delta f T_R - 180°$

MAGNETIC RESONANCE TOMOGRAPHY APPARATUS AND METHOD EMPLOYING A TRUE FISP SEQUENCE WITH IMPROVED OFF-RESONANT BEHAVIOR OF TWO SPIN ENSEMBLES

BACKGROUND OF THE INVENTION

1. Field of the Invention

The present invention is directed in general to magnetic resonance tomography as employed in medicine for examining patients. The present invention is thereby specifically directed to a magnetic resonance apparatus as well as to a method for the operation thereof wherein a pulse sequence known as a true-FISP pulse sequence is employed.

2. Description of the Prior Art

Magnetic resonance tomography is a tomographic method for medical diagnostics that is distinguished by a high contrast resolution capability. Due to its excellent ability to present soft tissue, magnetic resonance tomography has developed into a method that is far superior to X-ray computed tomography. Magnetic resonance tomography is currently based on the application of spin echo sequences and gradient echo sequences that enable an excellent image quality given measurement times on the order of minutes.

In the presentation of the tissue of a patient, however, artifacts occur that arise from the influence of the chemical shift at the boundary layers between fat and water. A "chemical shift" is the phenomenon that the resonant frequency shifts slightly in proportion to the field strength dependent on the type of chemical bond in which the excited nucleus participates. Due to their concentration in the human body, it is mainly hydrogen nuclei of free water and fat that contribute to the image. Their relative difference in resonant frequency amounts to about 3 ppm (parts per million). As a result thereof, a modulation of the signal intensity dependent on the echo time TE occurs given employment of steady state gradient echo sequences.

These artifacts must be avoided since they can lead to an incorrect diagnosis.

SUMMARY OF THE INVENTION

It is an object of the present invention to provide a nuclear magnetic resonance tomography apparatus and a method for the operation thereof wherein artifacts arising as a consequence of the chemical shift between a first spin ensemble, for example water, and a second spin ensemble, for example fat, are reduced or avoided.

This object is inventively achieved in a magnetic resonance tomography apparatus having a device for generating a FISP pulse sequence and for applying this sequence to a subject under examination. The pulse sequence is repeated with a repetition time $T_R$, with respectively different phase coding gradients and with an alternating operational sign of the flip angle $\alpha$ of the excitation pulse. The gradient pulse trains are thereby completely balanced, resulting in a true FISP pulse sequence.

In the inventive method and apparatus, a phase increment $\beta$ is provided between successive excitation pulses in addition to the alternating operational sign of the flip angle $\alpha$, so that the steady state signals for first and for second spin ensembles optionally have either the same or reversed signal polarities. Due to the incrementation of the phase by the amount $\beta$ between successive excitation pulses, a precession of the magnetic moments of the first and second spin ensembles is produced in the rotating reference system. Differing from the known true FISP sequences that, for example, are set to excite water as the first spin ensemble, so that only other spin ensembles, for example fat, precess in the rotating reference system, a precession of both magnetic moments is produced in the inventive method and apparatus as a result of the phase increment $\beta$. By appropriate variation of the magnitude of the phase increment $\beta$, the signal polarities of the measured steady state signal for the first and second spin ensembles can be selected such that they are either the same or reversed. Separate presentations of the first and second spin ensembles thus can be achieved in a simple way in the processing.

A further advantage of the inventive solution is that the repetition time $T_R$ is not fixed at specific time intervals in order to obtain the desired, relative signal polarities. In a known system that is set such that, for example, water as the first spin ensemble does not precess in the rotating reference system, $T_R$ must be selected such that the second ensemble precesses between $-180+k*720$ degrees and $+180+k*720$ degrees in order also to achieve positive polarity for the second spin ensemble. A reversed signal polarity is achieved for all precession angles that do not fall in this interval. Precession angles of exactly $(2k+1)*180$ degrees lead to a nearly completely disappearing steady state signal; values close to these interval limits exhibit a pronounced dependency of the signal strength on the precession angle that is highly disturbing, since the local precession angle cannot be exactly controlled as a result of unavoidable off resonance, for example due to field inhomogeneities.

Inventively, the additionally impressed phase increment $\beta$ achieves, with a given $T_R$, the result that the precession angles of both spin species are at an optimally large distance from these interval limits, but the possibility of free selection between identical and reversed signal polarities remains.

The value $\beta$ of the phase increment is advantageously selected such that the values of the precession angles $\beta_W$ and $\beta_F$ of the first and second spin ensembles optionally satisfy the conditions for identical signal polarities, or for reversed signal polarities, during the repetition time $T_R$.

Advantageously, the phase increment $\beta$ is selected such that the first and second spin ensembles simultaneously exhibit an optimally large difference angle from the respectively closest zero-axis signal crossing in the steady state signal. As a result, an efficient signal yield and a high stability of the system is assured, for example given small fluctuations of $T_R$.

The first spin ensemble can, for example, represent water and the second spin ensemble can represent fat.

As a result of the, free selection of the mutual signal polarities, a first dataset can be obtained on the basis of identical signal polarities and a second dataset can be obtained on the basis of reversed signal polarities.

By corresponding addition and/or subtraction of the first and second datasets, a pure image of the first or second spin ensemble can be obtained in a simple way.

DESCRIPTION OF THE PREFERRED EMBODIMENTS

Figure 1:
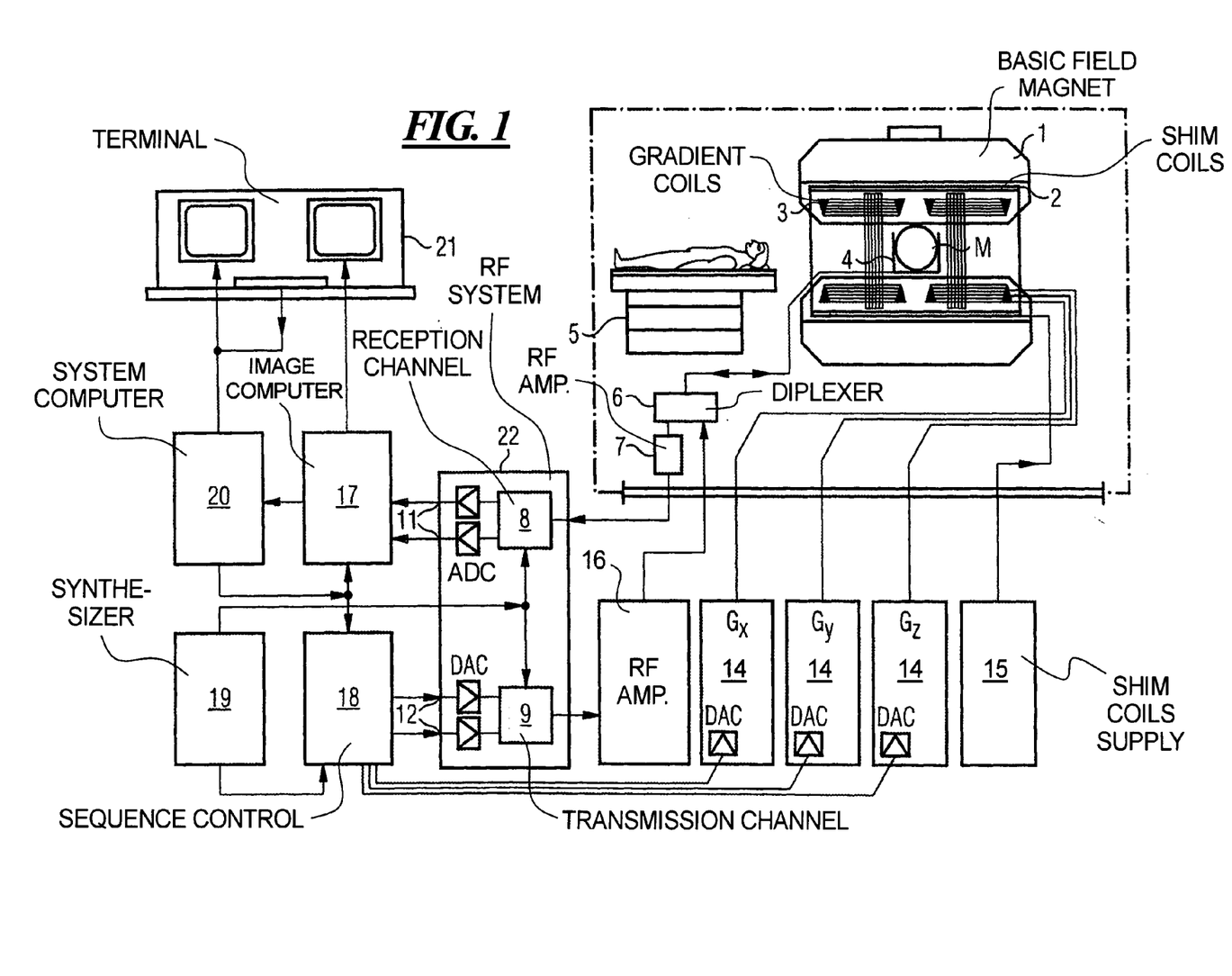
FIG. 1 schematically shows a nuclear magnetic resonance tomography apparatus operable in accordance with the invention.

FIG. 1 is a schematic illustration of a magnetic resonance tomography apparatus for generating a magnetic resonance image of a subject according to the present invention. The basic components of the magnetic resonance tomography apparatus correspond to that of a conventional tomography apparatus. A basic field magnet 1 generates a temporally constant, strong magnetic field for polarizing are thereby aligning nuclear spins in the examination region of a subject such as, for example, an examined part of a human body. The high homogeneity of the basic magnetic field required for the magnetic resonance measurement is defined in a spherical measurement volume M into which the parts of the human body to be examined are introduced. For assisting in satisfying the homogeneity requirements and, in particular, for eliminating time-invariable influences, shim plates of ferromagnetic material are attached at suitable locations. Time-variable influences are eliminated with shim coils 2 that are driven by a shim coil power supply 15.

A cylindrical gradient coil system 3 that is composed of three windings (coils) is introduced into the basic field magnet 1. An amplifier 14 supplies each winding with current for generating respective linear gradient fields in the directions of a Cartesian coordinate system. The first winding of the gradient field system 3 generates a gradient $G_x$ in the x-direction, the second winding generates a gradient $G_y$ in the y-direction and the third winding generates a gradient $G_z$ in the z-direction. Each amplifier 14 includes a digital-to-analog converter DAC that is driven by a sequence controller 18 for the generation of gradient pulses at the correct times.

A radio-frequency antenna 4 is located within the gradient field system 3, this antenna 4 converting the radio-frequency pulses supplied by a radio-frequency power amplifier 30 into a magnetic alternating field for excitation of the nuclei and alignment of the nuclear spins of the examined subject, or of the examined region of the subject. The radio-frequency antenna 4 also receives the alternating field emanating from the precessing nuclear spins, i.e. the nuclear magnetic resonance echo signals usually produced by a pulse sequence composed of one or more radio-frequency pulses and one or more gradient pulses, and the received signals are supplied as a voltage to an amplifier 7 and from there to a radio-frequency reception channel 8 of a radio-frequency system 22. The radio-frequency system 22 also has a transmission channel 9 in which the radio-frequency pulses for the excitation of the nuclear magnetic resonance are generated. The respective radio-frequency pulses are digitally presented in the sequence controller 18 as a sequence of complex numbers on the basis of a pulse sequence prescribed by the system computer 20. From an input 12, this numerical sequence is supplied as a real part and an imaginary part to a digital-to-analog converter DAC in the radio-frequency system 22 and is supplied from the latter to a transmission channel 9. In the transmission channel 9, the pulses sequences are modulated onto a radio-frequency carrier signal having a base frequency that corresponds to the resonant frequency of the nuclear spins in the measurement volume.

Switching from the transmission mode to the reception mode ensues via a transmission-reception diplexer 6. The radio-frequency antenna 4 radiates the radio frequency pulses for excitation of the nuclear spins into the measurement volume M and samples resulting echo signals. The acquired nuclear magnetic resonance signals are demodulated in phase-sensitive fashion in the reception channel 8 of the radio-frequency system 22 and are converted via the analog-to-digital converter ADC into a real part and an imaginary part of the measured signal. An image computer 17 reconstructs an image from the measured data acquired in this way. Administration of the measured data, the image data, and the control programs ensues via the system computer 20. The sequence controller 18 controls the generation of the respectively desired pulse sequences and the corresponding sampling of k-space on the basis of control programs. In particular, the sequence controller 18 controls the switching of the gradients at the correct time, the transmission of the radio-frequency pulses with defined phase and amplitude as well as the reception of the nuclear magnetic resonance signals. The timing signals for the radio-frequency system 22 and the sequence controller 18 are made available by a synthesizer 19. The selection of corresponding control programs for generating a magnetic resonance image ensues via a terminal 21 that has a keyboard as well as one or more picture screens.

According to the present invention, the magnetic resonance tomography apparatus is operated with a true FISP pulse sequence.

Figure 2:
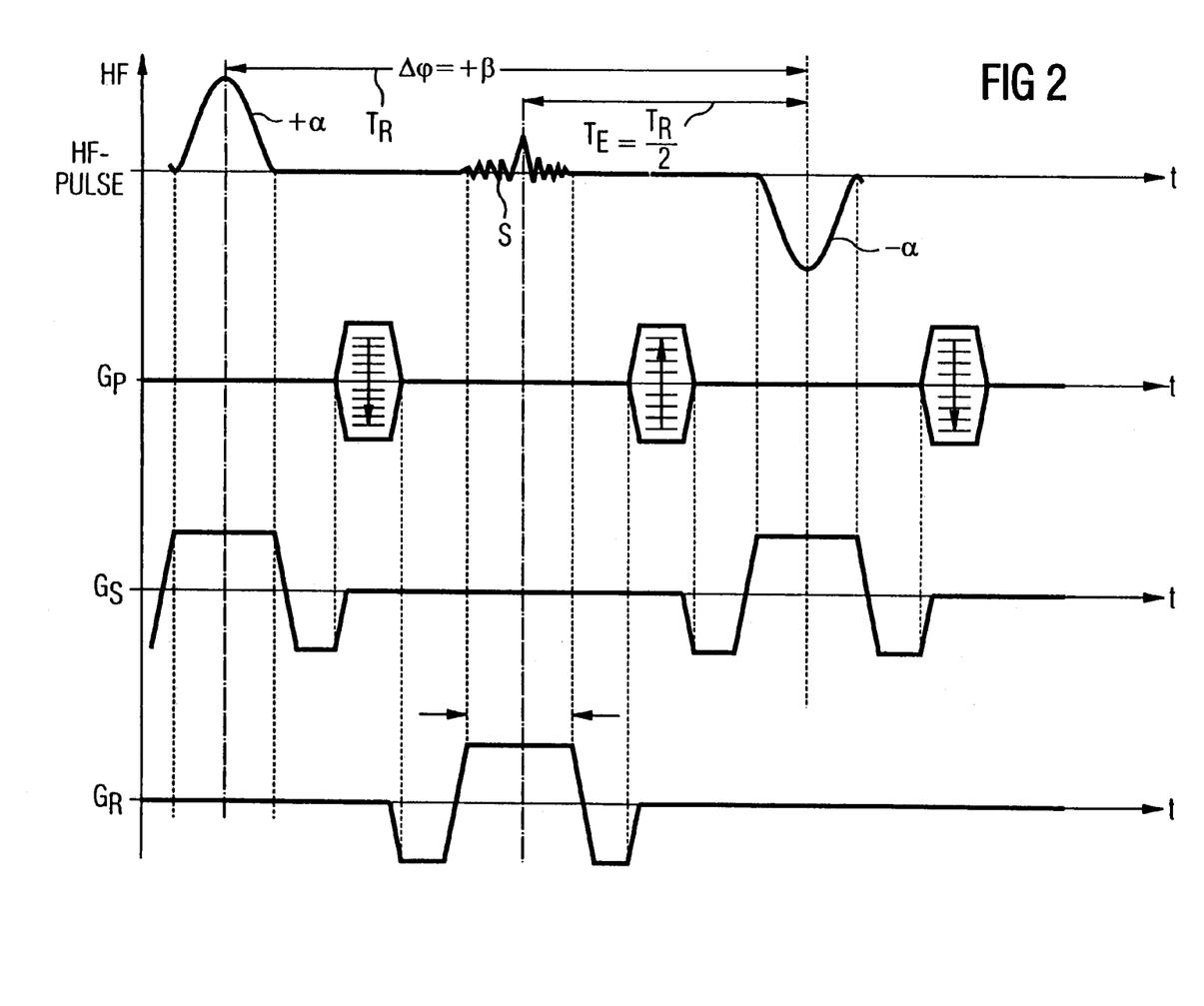
FIG. 2 shows a true FISP pulse sequence (FISP sequence with completely balanced gradient pulse trains) with a phase increment $\Delta\Phi=\beta$ as employed according to the invention.

FIG. 2 shows such a true FISP sequence. FISP stands for "fast imaging with steady precession" and is a specific form of the gradient echo sequence.

As in conventional imaging sequences, a rephasing with respect to a slice selection gradient $G_S$ and a pre-dephasing with respect to a readout gradient also occurs here. The dephasing of the transverse magnetization produced by the gradients is compensated by this gradient switching, so that an echo signal arises, referred to as a gradient echo. The basic idea, thus, is that the transverse magnetization is restored after the signal readout and can be used for the next sequence execution.

The echo signal is generated exclusively by gradient reversal.

The repetition time $T_R$ is the time after which one RF excitation pulse follows another. The echo signal ensues after the time $$T_E = \frac{T_R}{2}$$

and can be acquired with the readout gradient $G_R$.

The true FISP signal is distinguished by a complete symmetry in the time domain, i.e. the gradient pulse trains are completely balanced. All magnetization components are again refocused as a result of the complete symmetry of the gradient pulse trains in the time domain, so that the ideal steady state signal arises after a short transiency.

For phase coding, a gradient field is activated for a fixed time before the acquisition of the steady state signal and after the acquisition, the strength of this gradient field being decreased or increased in steps by the amount $\Delta G_R$ in successive sequence executions.

The true FISP sequence makes high demands on the calibration of the hardware and software because a misadjustment leads to unacceptable interference stripes in the image.

The RF pulses have an operation sign of the flip angle which alternates from pulse-to-pulse α. In addition to the alternating operational sign of the flip angle α, a phase increment ΔΦ=β is also generated, i.e. a difference in the phase of two successive RF pulses is produced. In other words, the phase of a following RF pulse is respectively raised by the value β compared to the preceding pulse. This phase increment ΔΦ with the magnitude β produces a precession of the water spins in the rotating reference system, in addition to the precession of the fat spins.

It should be noted that the repetition time $T_R$, the readout time $T_E$ and the rest of the system are usually matched to water in a true FISP pulse sequence, as shown for example, in FIG. 2, so that the water spins do not precess in the rotating reference system, i.e. they are "on-resonance". The precession angle $β_W$ of water is zero, $β_W=0$. All other spin ensembles such as, for example, the second strongest spin ensemble, fat, precess in the rotating reference system. The spin ensemble, fat, precesses by the angle $β_F$ during the repetition time.

Due to the use of the aforementioned phase increment ΔΦ=β between successive RF pulses, a precession of the water spins in the rotating reference system also is accomplished. The mechanism is explained more precisely with reference to FIGS. 3a and 3b. As the two spin ensembles providing the strongest signal, the water spins and the fat spins precess with different velocities. During the repetition time $T_R$, i.e. between two readout times, the fat spins precess by an angle $β_F$ and the water spins precess by an angle $β_W$. These precession angles $β_F$ and $β_W$ can be varied by a corresponding setting and selection of the value β of the phase increment Δβ, so that the respective signal polarity of the steady state signals of water and fat can be individually set. For example, a first value of β is selected such that the resulting steady state signals of water and fat have the same signal polarities, whereupon another value of β is selected at which the steady state signals of water and fat exhibit opposite signal polarities. As a result, it is possible to filter out a pure steady state signal of water or fat by suitable addition and subtraction calculating steps and correspondingly display it. An exclusive presentation of the water spin ensemble or of the fat spin ensemble thus can be obtained in a simple way.

Figure 3A:
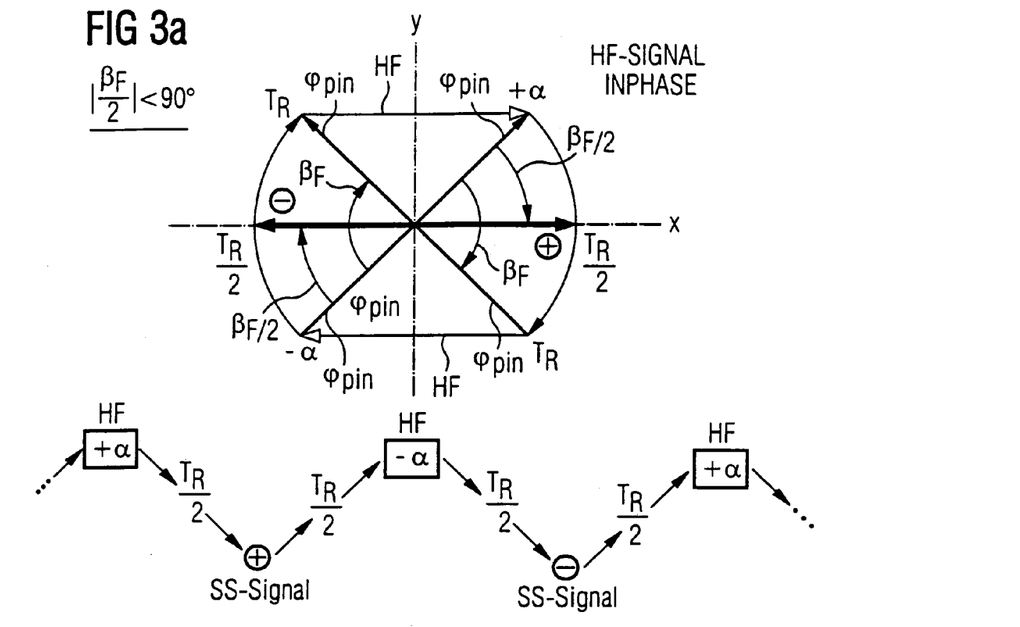
FIG. 3*a* explains the phase increment $\Delta\Phi=\beta$ by projection of the spin of a spin ensemble into the rotating reference plane x-y, whereby the RF signal is in-phase.
Figure 3B:
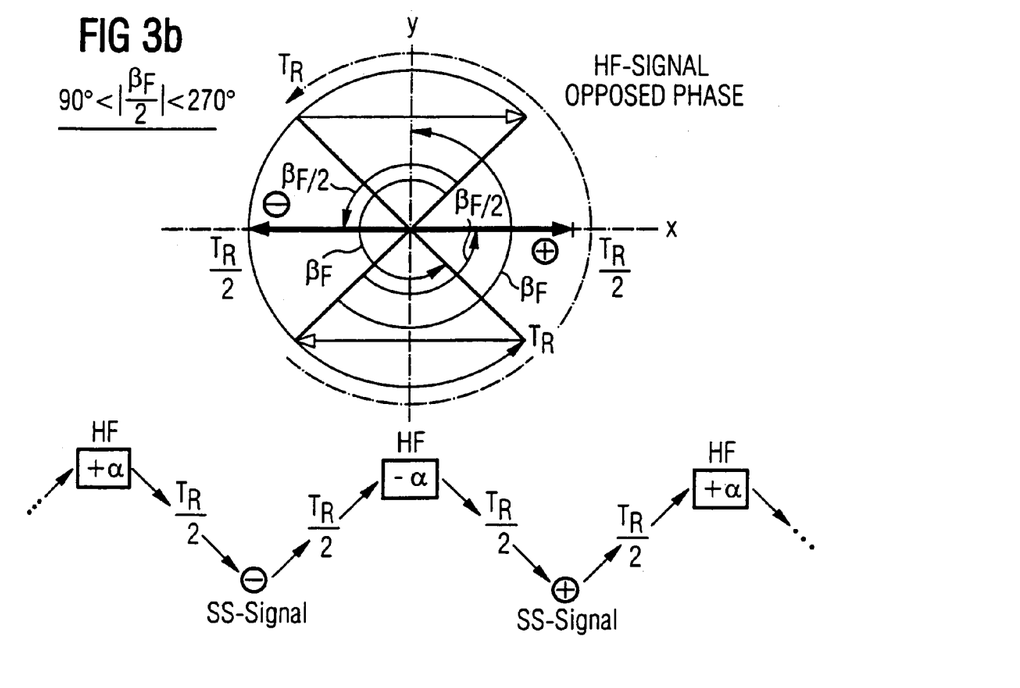
FIG. 3b explains the phase increment $\Delta\Phi=\beta$ by projection of the spin of a spin ensemble into the rotating reference plane x-y, whereby the RF signal is opposed phase.

FIGS. 3a and 3b explain the relationship between the precession angle, for example $β_W$ or $β_F$, of a spin ensemble and the resulting RF and steady state signals. FIGS. 3a and 3b show the projection of a spin of a spin ensemble into the rotating reference plane x-y. The spin of the spin ensemble traverses a precession angle $β_F$ in the repetition time $T_R$. More detailed explanations with reference to the angle of the precession angle $β_F$ of the spin ensemble, fat, are presented below with reference to FIGS. 3a and 3b. The explanations apply, of course, only for spins that precess in the rotating reference system, i.e. that are "off-resonant". Spins referred to as "on-resonant" spins do not precess in the rotating reference system but are folded back and forth on the x-axis by the RF signal with an alternating flip angle α. This, for example, is the case for water spins in the aforementioned system wherein the overall system is adapted to the resonance of the water spins, so that these do not precess in the rotating reference system. The case of precession of the spins in the rotating reference system, referred to as "off-resonant" spins, that applies for the present invention is shown in FIGS. 3a and 3b.

In FIG. 3a, the precession angle $β_F$ satisfies the mathematical condition $$\left|\frac{β_F}{2}\right| < 90°$$

Since a spin precesses by the angle $β_F$ during $T_R$, the spin is read out in phase with the RF signal in this case. This means that, following an RF pulse with positive operational sign (+α), the signal (steady state signal) that is read out likewise has a positive operational sign. FIG. 3a shows an example.

When a spin is initially located in the second quadrant of the rotating reference system, then the RF signal +α mirrors or folds it into the first quadrant. During the time in which no RF signal is present, i.e. in the repetition time $T_R$, the spin precesses by the angle $β_F$ into the fourth quadrant of the rotating reference system. When crossing the x-axis at $$T_E = \frac{T_R}{2}$$

after covering the angle $$\frac{β_F}{2},$$

the signal is read out with positive operational sign. After the time $T_R$, the spin, which is now located in the fourth quadrant of the rotating reference system, is mirrored into the third quadrant by the following RF signal α. After the time $$T_E = \frac{T_R}{2},$$

the spin again crosses the x-axis; the signal is read out with a negative operational sign. The spin is again situated at its original position after a further time $$\left|\frac{β_F}{2}\right| < 90°.$$

so that the operation begins anew.

The signal polarity is positive given the explained "in-phase" case, i.e.

$$\frac{T_R}{2},$$

This is because the spin vector crosses the positive x-axis after a positive RF pulse. A positive RF signal corresponds to a positive steady state signal. When the spin vector is in the fourth quadrant and is folded into the third quadrant by an RF signal, then it crosses the negative x-axis after the time $$\frac{T_R}{2},$$

so that a negative steady state signal arises. Negative RF pulse corresponds to a negative steady state signal.

In FIG. 3b, the spin signal that is read out (steady state signal) is "opposed phase" with respect to the RF signal. Here, the precession angle $\beta_F$ satisfies the mathematical condition $$90° < \left|\frac{\beta_F}{2}\right| < 270°,$$

i.e. the precession angle $\beta_F$ that the spin covers in the time $T_R$ is greater than 180°. In contrast to FIG. 3a, the signal polarity is negative. When a spin is located in the second quadrant of the rotating reference system and when it is subsequently mirrored into the first quadrant of the rotating reference system by a positive Rf signal, then it subsequently precesses into the fourth quadrant and thereby crosses the negative x-axis after the time $$T_E = \frac{T_R}{2}.$$

Although the RF signal was positive, a negative steady state signal results therefrom. The spin is subsequently folded into the third quadrant by a negative RF signal and precesses into the second quadrant in the time $T_R$. This time, the steady state signal is positive since it crosses over the positive part of the x-axis after the time $$\frac{T_R}{2}.$$

It can be clearly seen both in FIG. 3a as well as in FIG. 3b that the spin is not folded or flipped by a following RF pulse, and thus no steady state signal can be obtained in the specific instance $$\left|\frac{\beta_F}{2}\right| = 90°,$$

i.e. when the spin precesses by 180° during the time $T_R$. In this case, the steady state signal has a zero-axis crossing.

It should be noted that FIGS. 3a and 3b and the corresponding explanations respectively refer to the spin or the total magnetic moment of a spin ensemble. The signal obtained upon readout in the magnetic resonance tomography apparatus thus is the combination of the steady state signals of the spins of a number of spin ensembles, such as, for example, of the two spin ensembles, water and fat. The values $\beta_W$ and $\beta_F$ by which the first spin ensemble, water, and the second spin ensemble, fat, respectively precesses in the rotating reference system during the repetition time $T_R$ are directly defined by appropriate selection and setting of the value $\beta$ of the phase increment $\Delta\beta$. The value $\beta_F$ by which the second spin ensemble, fat, precesses in the rotating reference system during the repetition time $T_R$ is dependent on the repetition time $T_R$ and $\beta_W$ according to the following equation:

$$360°*\Delta f*T_R=\beta_F-\beta_W.$$

The chemical frequency shift $\Delta f$ between fat and water given, for example, a magnetic field $B_O$=1.5 T amounts to approximately 220 Hz.

Water does not precess without phase increment $\Delta\Phi$=0, so that $\beta_W$=0 applies. Given activation of a phase increment $\beta$, water precesses in the rotating reference system with $\beta_W$=−$\beta$, whereby the precession angle $\beta_F$ of fat changes according to the above equation.

In order to assure an optimally good stability of the system and in order to obtain a high signal yield, it is important that the value $\beta$ is selected such for a preset $T_R$ that fat and water simultaneously respectively have an optimally great difference angle from the respectively closest zero-axis signal crossing of the steady state signal. Since water as well as fat precess in the rotating reference system, $T_R$ need not be exactly adjusted in order to keep the system stable.

Figure 4:
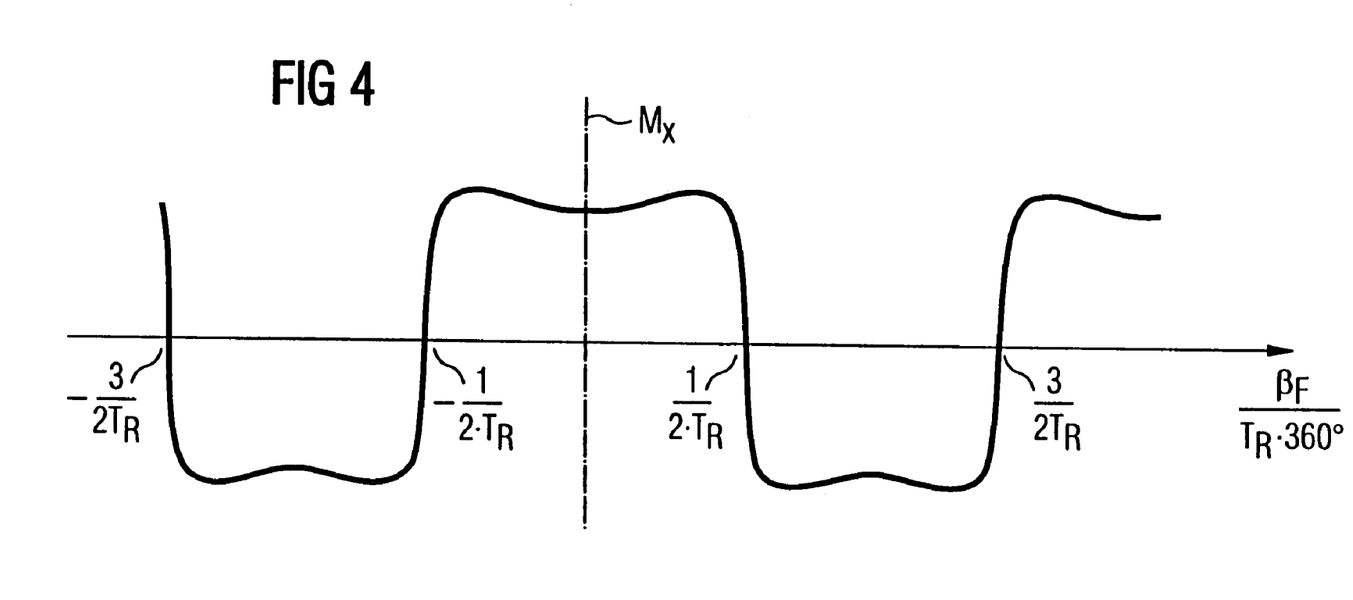
FIG. 4 shows the SSFP signal given off-resonance dependent on the chemical frequency shift $\Delta f$.

FIG. 4 shows the SSFP signal (resonance signal) of a spin ensemble (for example, fat) given off-resonance dependent on $$\frac{\beta_F}{T_R*360°}.$$

Given an arbitrarily selected repetition time $T_R$, the steady state signal has a real, positive signal at the readout time $$T_E = \frac{T_R}{2}$$

given spins that precess by less than approximately ±180°

$$\left(\pm\frac{1}{2T_R}\right)$$

per $T_R$. Precession angles of ±180° through ±540°

$$\left(\pm\frac{1}{2T_R}\text{through}\pm\frac{3}{2T_R}\right)$$

yield real signals with negative polarity, etc. Given 180°+ k*360° precession, the steady state signal amplitude has a zero-axis crossing. Values for zero-axis signal crossings are, for example $$-\frac{3}{2T_R},-\frac{1}{2T_R},+\frac{1}{2T_R},+\frac{3}{2T_R},\ldots$$

As mentioned above, the value $\beta$ of the phase increment $\Delta\Phi$ should be set such that the precession angles $\beta_F$ and $\beta_W$ of fat or water do not lie in the proximity of a signal zero-axis crossing in the respective resonance signal and each have an optimally great difference angle therefrom. For example, such a case would be:

$\beta_W = -90°$ $\beta_F = +90°$

The RF signals are in-phase (see FIG. 3a) for both spin collectives, which leads to the same signal polarities for water and fat.

An example of unequal signal polarities would be:

$\beta_W = +90°$ $\beta_F = +270°$

Here, the resonance signal for fat lies in the negative real range. The corresponding RF signal is opposed phase. With the positive resonance signal of water, this leads to a combination of unequal signal polarities in the measured overall resonance signal.

FIGS. 5a through 5c, and 6a through 6d are intended to more specifically explain the two instances $$\left|\frac{\beta_{F,W}}{2}\right| < 90°$$

and $$90° < \left|\frac{\beta_{F,W}}{2}\right| < 270°,$$

and thus the free selection possibility between identical and unequal signal polarities of the resonance signals of fat and water dependent on impressing a phase increment $\Delta\Phi=\beta$ between the successive RF pulses.

Figure 5A:
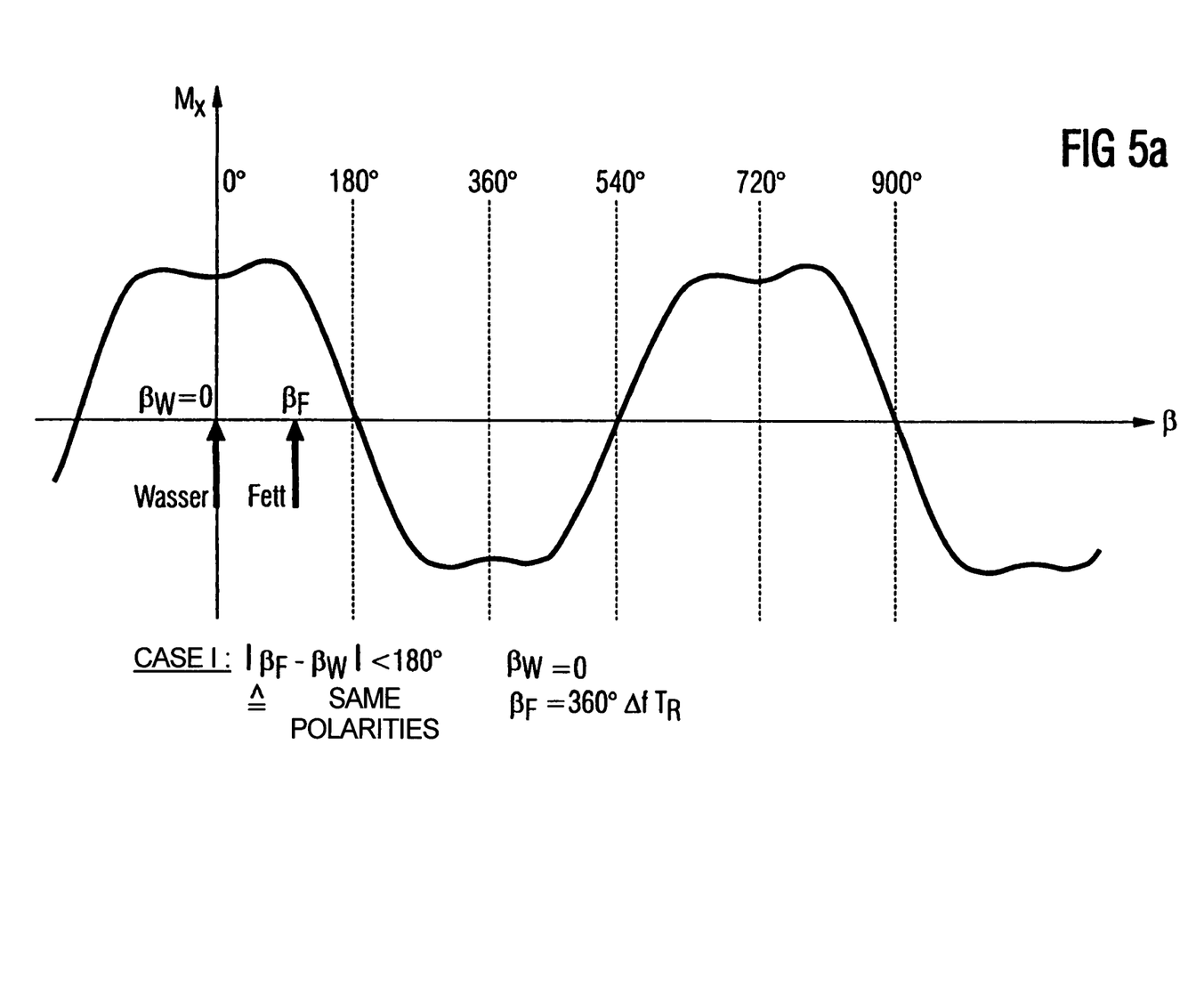
FIGS. 5a through 5c and FIGS. 6a through 6d show the steady state signal dependent on the off-resonance angle taking a number of different cases into consideration.

In the case of FIG. 5a, water is on resonant, i.e. the water has no precession whatsoever ($\beta_W=0$) in the rotating reference system. The fat is off resonant and has the precession angle $\beta_F$. The respective signals of water and fat have the same operational sign, both have a positive steady state signal, so that a correspondingly large value arises in the measured overall resonance signal.

Figure 5B:
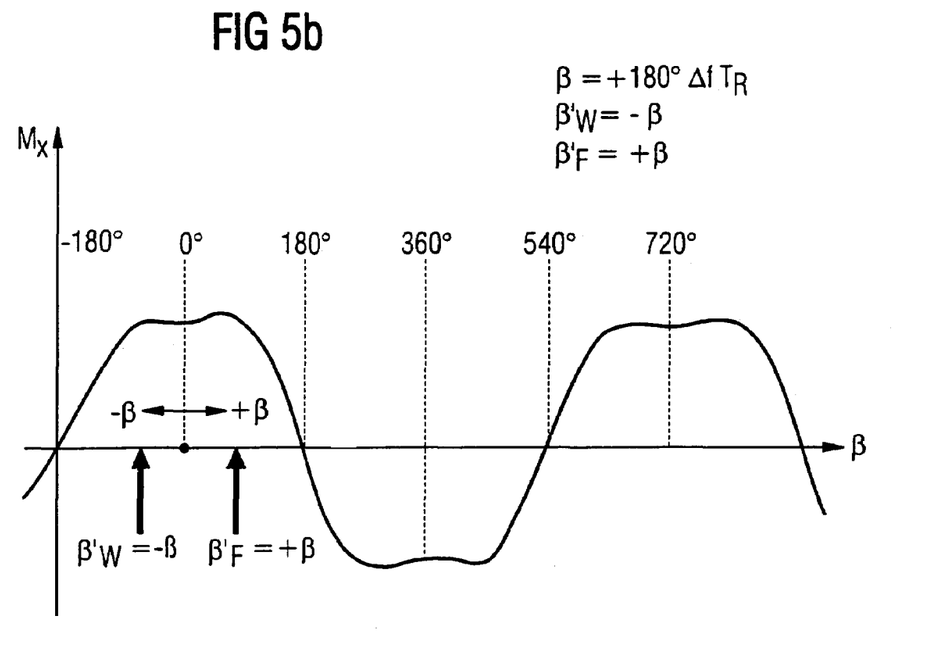

According to FIG. 5b, the phase increment $\Delta\Phi=\beta$ is inventively selected with a given $T_R$ so that the precession angles $\beta_W$ and $\beta_F$ of water or fat come to lie symmetrically around the phase 0°. The condition for this is:

$$\beta = 180° * \Delta f * T_R = \frac{\beta_F - \beta_W}{2}$$

The zero point thus is placed exactly in the middle between water and fat. As a result, water and fat are respectively displaced to new precession angles of $\beta'_W=-\beta$, $\beta'_F=+\beta$. Both precession angles have the same distance from the respective signal zero-axis crossing.

Figure 5C:
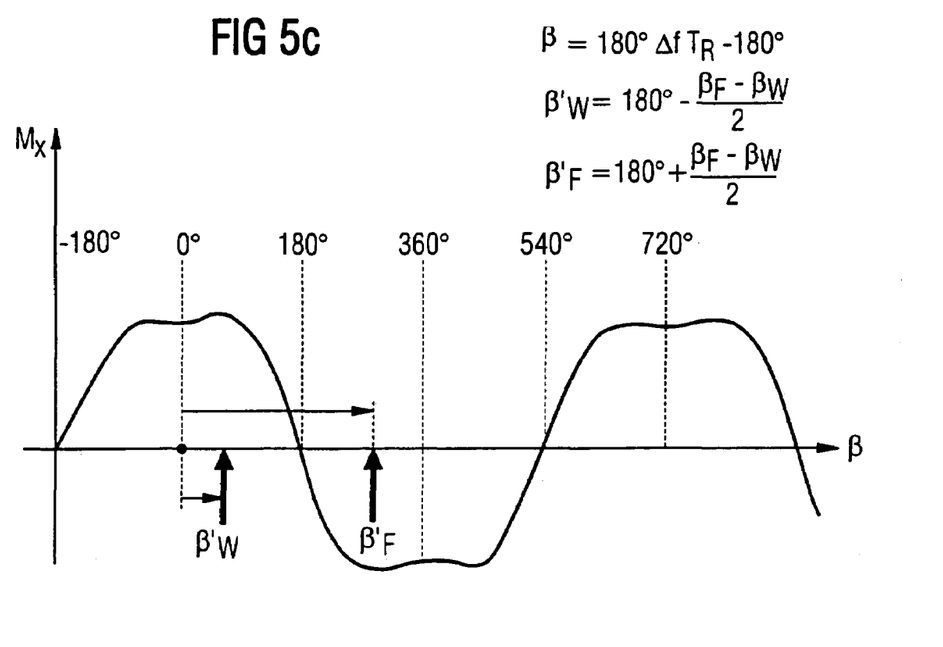

In FIG. 5c, $\Delta\Phi=\beta$ is inventively selected with a given $T_R$ so that the precession angles of water and fat come to lie symmetrically around the phase 180°. To this end, the phase increment $\beta$ in the case of FIG. 5b is increased by 180°, i.e. $\beta \rightarrow \beta+180°$. The condition for this is $$\beta = 180° * \Delta f * T_R - 180° = \frac{\beta_F - \beta_W}{2} - 180°.$$

The fat thus comes to lie under the negative part, the water under the positive part of the steady state signal. This leads to a reversed polarity of the respective resonance signals. Both new precession angles $$\beta'_W = 180° - \frac{\beta_F - \beta_W}{2}$$

and $$\beta'_F = 180° + \frac{\beta_F - \beta_W}{2}$$

are again equidistant from the signal zero-axis crossing at 180°. Moreover, "equidistant" means that they are maximally insensitive to, for example, field inhomogeneities.

Figure 6A:
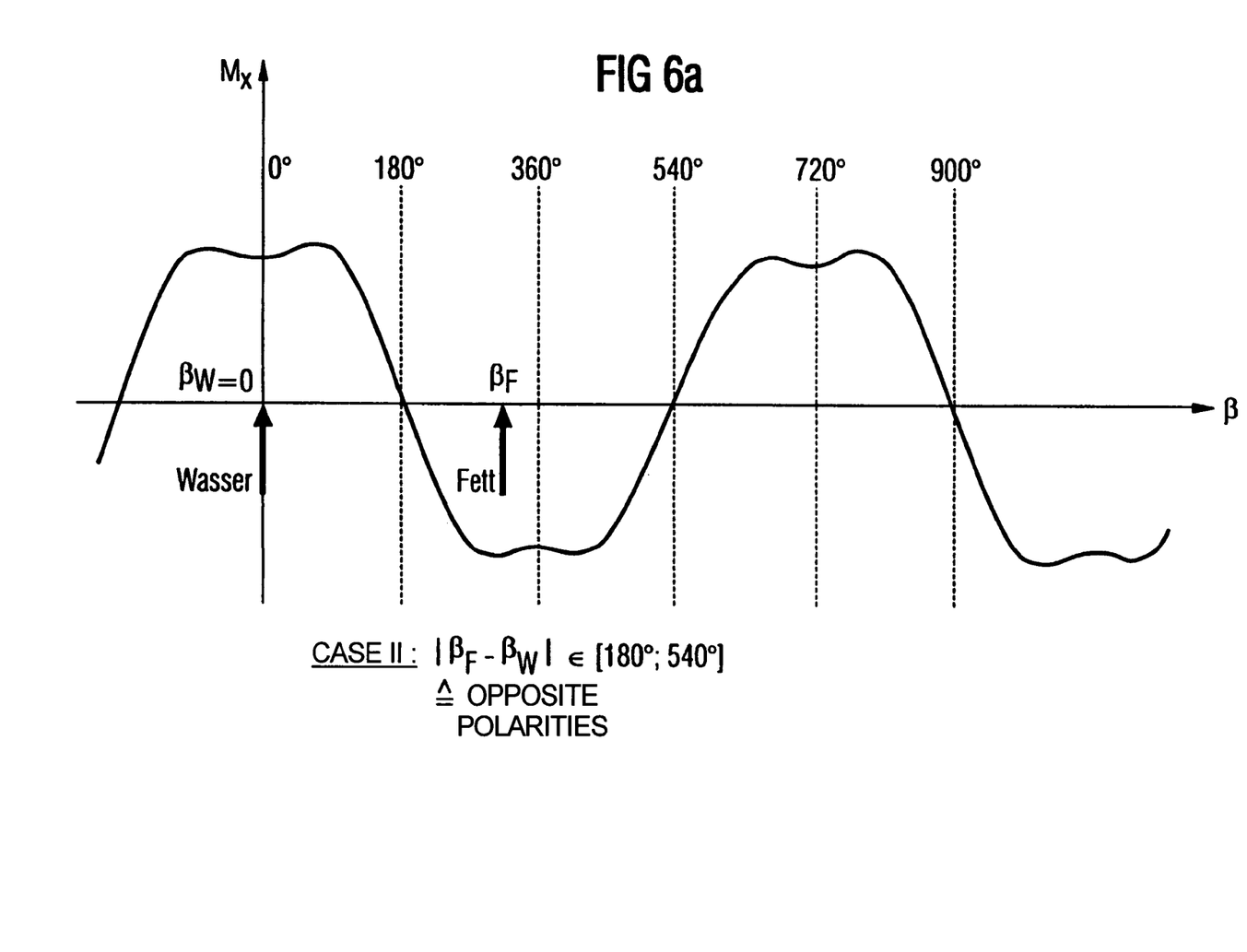

The case of $|\beta_F - \beta_W|$ lying between 180° and 540° is shown in FIG. 6a. The fat has a negative signal when water is on resonant ($\beta_W=0$).

Figure 6B:
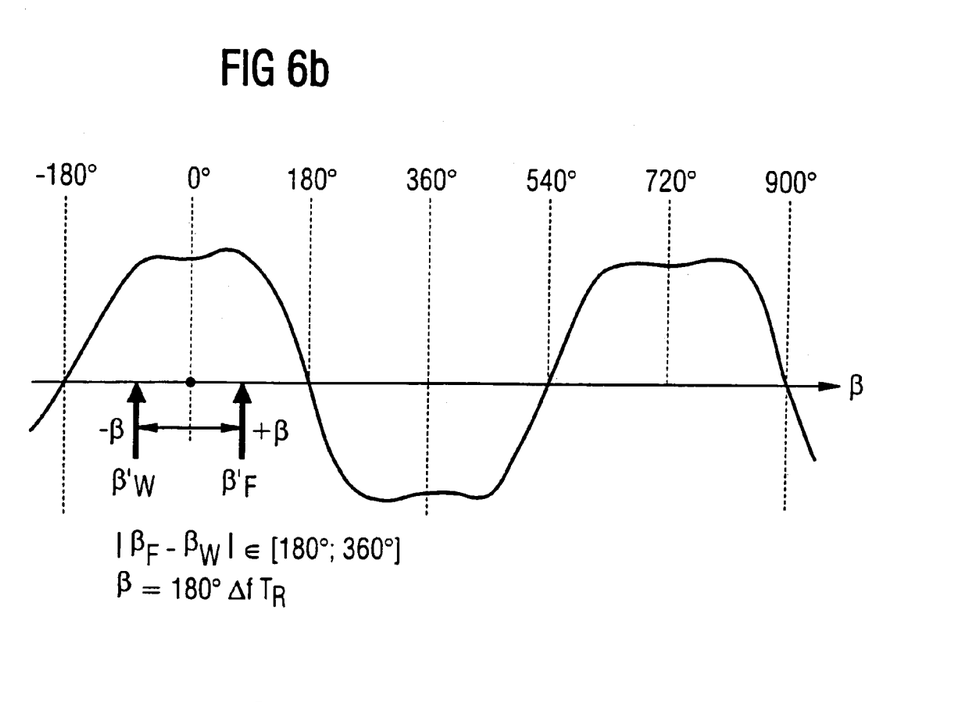
Figure 6C:
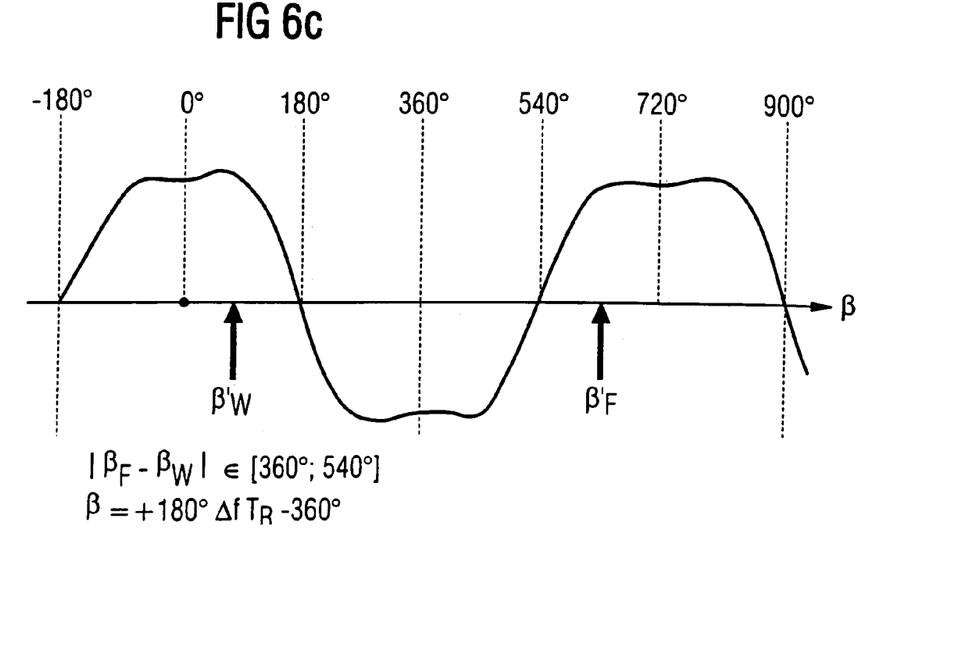

In this second case, both instances, namely that fat and water yield identical or reversed operational signs, again can be achieved by a suitable selection of $\beta$. However, there are two case distinctions, FIG. 6b and FIG. 6c, for the case of identical polarity. When $|\beta_F-\beta_W|$ lies between 180° and 360°, fat and water both have a positive signal. When $|\beta_F-\beta_W|$ stems from the range [360°; 540°], fat and water lie in different positive signal curves. In both instances, fat and water have the same positive polarity. The conditions for this are:

$\beta=180°*\Delta f*T_R$ (FIG. 6b)

i.e. $\beta'_W$ and $\beta'_F$ are symmetrical around the phase 0°, and $\beta=180°*\Delta f*T_R-360°$ (FIG. 6c)

i.e. $\beta'_W$ and $\beta'_F$ are symmetrical around the phase 360°.

Figure 6D:
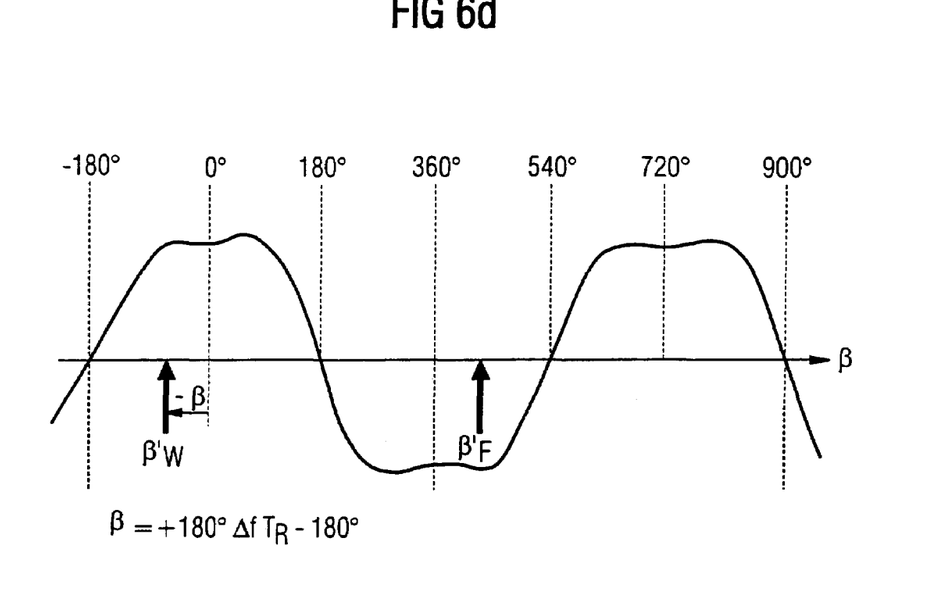

For the case of reversed polarity, shown in FIG. 6d, $\beta$ again can be selected such that fat and water come to lie symmetrically around the phase 180°. The water signal is positive and the fat signal is negative. Opposite polarity is present given equidistant signal zero-axis crossings.

Although modifications and changes may be suggested by those skilled in the art, it is the intention of the inventor to embody within the patent warranted hereon all changes and modifications as reasonably and properly come within the scope of his contribution to the art.

I claim as my invention:

1. A magnetic resonance tomography apparatus comprising:
   a basic magnetic field system which generates a static basic magnetic field having a volume adapted to receive a subject containing different nuclei which, when excited to produce precessing nuclear spins, respectively represent a first spin ensemble and a second spin ensemble having respective steady state signals associated therewith;
   a gradient coil system which emits gradient pulse trains respectively for a slice selection gradient, a phase coding gradient having a phase coding direction, and a readout gradient;
   a radio-frequency system which emits RF excitation pulses to excite said nuclear spins and which, under said readout gradient, receives said respective steady state signals; and a sequence controller which operates said radio-frequency system and said gradient coil system to generate a FISP pulse sequence in said volume, said FISP pulse sequence including a plurality of RF excitation pulses separated by respective repetition times, with each repetition time being incremented relative to an immediately preceding repetition time by a phase angle increment, and with respective flip angles $\leq 90°$ that alternate in sign from excitation pulse-to-excitation pulse, so that said steady state signals have respective signal polarities with a relationship selected from the group consisting of identical signal polarities and opposite signal polarities, and wherein said FISP pulse sequence further includes respective phase coding gradients that alternate as to said phase coding direction from repetition time-to-repetition time, and completely balanced gradient pulse trains within each repetition time.

2. A magnetic resonance tomography apparatus as claimed in claim 1 wherein said first spin ensemble has a first precession angle associated therewith and wherein said second spin ensemble has a second precession angle associated therewith, and wherein said sequence controller selects said phase angle increment so that said first and second precession angles satisfy respective mathematical conditions for a selected one of said signal polarity relationships.

3. A magnetic resonance tomography apparatus as claimed in claim 1 wherein each of said steady state signals is referenced relative to a zero-axis, and wherein each steady state signal exhibits zero-axis crossings, and wherein said sequence controller selects said phase angle increment to maximize a difference angle between closest respective zero-axis crossings of the respective steady state signals.

4. A magnetic resonance tomography apparatus as claimed in claim 1 wherein said sequence controller operates said radio-frequency system to excite water nuclei as said first spin ensemble and fat nuclei as said second spin ensemble.

5. A magnetic resonance tomography apparatus as claimed in claim 1 further comprising an image computer connected to said radio-frequency system for obtaining and storing a first image dataset when said polarities are identical and for obtaining and storing a second image dataset when said polarities are opposite.

6. A magnetic resonance tomography apparatus as claimed in claim 5 wherein said image computer generates a pure image of a selected one of said first spin ensemble and said second spin ensemble by combining said first and second image datasets by operations selected from the group consisting of addition and subtraction.

7. A magnetic resonance tomography apparatus as claimed in claim 1 wherein said sequence controller generates each phase angle increment as one-half of the phase angle increment of the immediately preceding repetition time.

8. A method for operating a magnetic resonance tomography apparatus comprising the steps of:
generating a static basic magnetic field having a volume adapted to receive a subject containing different nuclei which, when excited to produce precessing nuclear spins, respectively represent a first spin ensemble and a second spin ensemble having respective steady state signals associated therewith;
providing a gradient coil system which emits gradient pulse trains respectively for a slice selection gradient, a phase coding gradient having a phase coding direction, and a readout gradient;
providing a radio-frequency system which emits RF excitation pulses to excite said nuclear spins and which, under said readout gradient, receives said respective steady state signals; and
operating said radio-frequency system and said gradient coil system to generate a FISP pulse sequence in said volume, said FISP pulse sequence including a plurality of RF excitation pulses separated by respective repetition times, with each repetition time being incremented relative to an immediately preceding repetition time by a phase angle increment, and with respective flip angles $\leq 90°$ that alternate in sign from excitation pulse-to-excitation pulse, so that said steady state signals have respective signal polarities with a relationship selected from the group consisting of identical signal polarities and opposite signal polarities, and wherein said FISP pulse sequence further includes respective phase coding gradients that alternate as to said phase coding direction from repetition time-to-repetition time, and completely balanced gradient pulse trains within each repetition time.

9. A method as claimed in claim 8 wherein said first spin ensemble has a first precession angle associated therewith and wherein said second spin ensemble has a second precession angle associated therewith, and comprising selecting said phase angle increment so that said first and second precession angles satisfy respective mathematical conditions for a selected one of said signal polarity relationships.

10. A method as claimed in claim 8 wherein each of said steady state signals is referenced relative to a zero-axis, and wherein each steady state signal exhibits zero-axis crossings, and comprising selecting said phase angle increment to maximize a difference angle between closest respective zero-axis crossings of the respective steady state signals.

11. A method as claimed in claim 8 comprising operating said radio-frequency system to excite water nuclei as said first spin ensemble and fat nuclei as said second spin ensemble.

12. A method as claimed in claim 8 comprising obtaining and storing a first image dataset when said polarities are identical and for obtaining and storing a second image dataset when said polarities are opposite.

13. A method as claimed in claim 12 comprising generating a pure image of a selected one of said first spin ensemble and said second spin ensemble by combining said first and second image datasets by operations selected from the group consisting of addition and subtraction.

14. A method as claimed in claim 8 comprising generating each phase angle increment as one-half of the phase angle increment of the immediately preceding repetition time.

* * * * *